(12) United States Patent
Elfadel et al.

(10) Patent No.: US 7,401,014 B2
(45) Date of Patent: Jul. 15, 2008

(54) METHOD FOR ORDER SELECTION IN PASSIVE TRANSMISSION LINE MACROMODELS BASED ON THE LIE CRITERIA

(75) Inventors: Ibrahim M. Elfadel, Ossining, NY (US); Hao Ming Huang, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 10/969,743

(22) Filed: Oct. 19, 2004

(65) Prior Publication Data

US 2006/0085171 A1 Apr. 20, 2006

(51) Int. Cl.
G01R 27/08 (2006.01)
G06F 17/50 (2006.01)
(52) U.S. Cl. .......................... 703/14; 324/691
(58) Field of Classification Search ............ 703/14, 703/13; 324/691
See application file for complete search history.

(56) References Cited

U.S. PATENT DOCUMENTS 6,694,289 B1 * 2/2004 Chen ..................... 703/14

OTHER PUBLICATIONS

David K. Cheng. "Field and Wave Electromagnetics" Nov. 1992. Addison-Wesley Publishing Company, Inc. Second Edition, pp. 437-441.*

Elfadel, I. M. et al., "A Comparative Study of Two Transient Analysis Algorithms for Lossy Transmission Lines With Frequency-Dependent Data", May 2002, pp. 143-153, IEEE Transactions on Advanced Packaging, vol. 25, No. 2.

Dounavis A. et al., "Delay Extraction and Passive Macromodeling of Lossy Coupled Transmission Lines", pp. 251-254, IEEE 2003.

Grivet-Talocia, S. et al., "Transient Analysis of Lossy Transmission Lines: An Efficient Approach Based on the Method of Characteristics", Feb. 2004, pp. 45-56, IEEE Transactions On Advanced Packaging, vol. 27, No. 1.

Gruodis, A. J. et al., "Coupled Lossy Transmission Line Characterization And Simulation", Jan. 1981, pp. 25-41, IBM J. Res. Develop. vol. 25, No. 1.

* cited by examiner

*Primary Examiner*—David Vincent
*Assistant Examiner*—Ben M Rifkin
(74) *Attorney, Agent, or Firm*—Harrington & Smith, PC

(57) ABSTRACT

A passive macromodel for lossy, dispersive multiconductor transmission lines uses a multiplicative approximation of the matrix exponential known as the Lie product. The circuit implementation of the macromodel is a cascade of elementary cells, each cell being the combination of a pure delay element and a lumped circuit representing the transmission line losses. Compared with passive rational macromodeling, the Lie product macromodel is capable of efficiently simulating long, low-loss multiconductor transmission lines while preserving passivity. This result is combined with transmission line theory to derive a time-domain error criterion for the Lie product macromodel. This criterion is used to determine the minimum number of cells needed in the macromodel to assure that the magnitude of the time-domain error is less than a given engineering tolerance.

7 Claims, 6 Drawing Sheets

METHOD FOR ORDER SELECTION IN PASSIVE TRANSMISSION LINE MACROMODELS BASED ON THE LIE CRITERIA

FIELD OF THE INVENTION

The present invention relates to order selection in passive transmission line macromodels based on the Lie decomposition. More specifically, the invention relates to a time-domain error criterion for the Lie product macromodel. The error criterion is then used to derive a lower bound on the number of cells needed in the macromodel so that the worst-case time-domain error magnitude is less than a given engineering tolerance.

BACKGROUND OF THE INVENTION

High-performance electrical system design requires the use of sophisticated interconnections between system components. These interconnections must be designed to achieve three interrelated objectives: minimize signaling delay between components; minimize electromagnetic cross talk noise between interconnections; and ensure immunity to external electromagnetic interferences. Two main examples of these interconnections are multiconductor transmission lines and connectors.

Transmission lines are interconnects whose electrical length is large compared with the wavelength of the transmitted signal. A transmission line macromodel is a mathematical model that enables analysis and simulation of transmission lines in electrical circuits. Passivity of the macromodel is advantageous because it results in a more robust, reliable and efficient transmission line analysis.

Multiconductor transmission lines are present throughout any electrical system comprising several integrated circuits (chips). They are used on a printed circuit board (PCB) for signal transmission between different chipsets. Multiconductor transmission lines are also used to transfer signals inside a package containing the chip as well as to transfer signals inside the chip itself. PCB and package transmission lines are known in the art as off-chip transmission lines while the lines responsible for transferring signals within the chip are known in the art as on-chip transmission lines. The transmission line nature of an interconnection depends on the wavelength of the signal carried by the interconnection. With the constant increase in electronic system speed, the signal wavelengths are becoming shorter. The net result is that more and more of the interconnections are behaving as transmission lines, which makes the task of modeling and analyzing overwhelming. The situation is rendered even more complex by the fact that the on-chip and off-chip transmission lines behave very differently in terms of the losses (i.e., attenuation and the distortion) incurred by the signals they carry. Because of their small cross sections, on-chip transmission lines are very lossy relative to off-chip transmission lines. Among off-chip transmission lines, packaging transmission lines are in general more lossy than PCB transmission lines. These differences in location (on-chip, off-chip), length (short, long), losses (high, low), and signal wavelength make the efficient modeling, simulation, and analysis of transmission lines a difficult engineering task.

In an article by A. Dounavis et al entitled "Delay extraction and passive macromodeling of lossy coupled transmission lines" in Digest of Electrical Performance of Electronic Packaging, volume 12, pages 251-254, Princeton, N.J., October 2003, a passive macromodel for lossy, dispersive multiconductor transmission lines has been proposed. The article is hereby incorporated herein by reference. The macromodel was a multiplicative approximation of the matrix exponential known as the Lie product. The circuit implementation of the macromodel is a cascade of elementary cells, each cell being the combination of a pure delay element and a lumped circuit representing the transmission line losses.

The present invention combines the results of the Dounavis et al paper with transmission line theory to derive a time-domain error criteria for the Lie product macromodel. The error criteria is then used to derive a lower bound on the number of cells needed in the macromodel so that the worst-case magnitude of the time-domain error is less than a given engineering tolerance.

SUMMARY OF THE INVENTION

The derivation of the error criteria is based on a time-domain analysis of the error-generation mechanism of the transmission line macromodel, namely, the impedance mismatch between the characteristic impedance of the delay element and the impedance of the lumped circuit in each cell of the macromodel.

The Lie decomposition of the multiconductor transmission line includes a first delay element, a resistive mesh and a second delay element connected in series. The decomposition macromodel of a single conductor transmission line includes a series of delay elements located between a source including its impedance and a resistive load. The impedance mismatch between the elements causes reflected pulses. The reflected pulses are measured and analyzed for calculating the error criteria for a predetermined tolerance. The calculated value is then used to determine the number of segments into which the transmission line needs to be divided for a Lie decomposition macromodel.

A principal object of the present invention is therefore, the provision of a method for performing circuit simulation of a transmission line based on a Lie decomposition multiconductor macromodel combined with transmission line theory.

Another object of the present invention is the provision of a method for deriving an error criteria based on a time-domain analysis of the error-generation mechanism in a transmission line macromodel.

A further object of the present invention is the provision of a method of determining a lower bound on the number of segments into which a transmission line is divided for a Lie decomposition multiconductor macromodel.

A still further object of the present invention is the provision of a method of determining a lower bound for a predetermined error tolerance on the number of segments into which a transmission line is divided for a Lie decomposition multiconductor macromodel.

Further and still other objects of the present invention will become more clearly apparent when the following description is read in conjunction with the accompanying drawing.

DETAILED DESCRIPTION

The basic elements of the transmission line macromodeling method proposed in Dounavis et al begins with a multiconductor transmission line (MTL) of n+1 conductors and length d. The frequency-domain transfer matrix form of the Telegrapher's equations is:

$$\begin{bmatrix} V(d,s) \\ -I(d,s) \end{bmatrix} = e^{-d\Phi(s)} \begin{bmatrix} V(0,s) \\ I(0,s) \end{bmatrix} \text{ with } \Phi(s) = \Lambda + s\Delta, \quad (1)$$

$$\Lambda = \begin{bmatrix} 0 & R \\ G & 0 \end{bmatrix}, \Delta = \begin{bmatrix} 0 & L \\ C & 0 \end{bmatrix}$$

where R, L, G and C are the per-unit-length parameter matrices, and (V 0,s), I(0,s)) and (V(d,s), I(d,s)) are the voltage-current pairs at the near and far end ports of the transmission line, respectively. Where R is the per-unit-length reistance, L is the per-unit-length inductance, G is the per-unit-length conductance, and C is the per-unit-length capacitance of the transmission line. Assume now that the multiconductor transmission line has been segmented into m segments each of length d/m, and consider the matrix $$P_m(s) = e^{-\frac{d}{2m}s\Delta} e^{-\frac{d}{m}\Lambda} e^{-\frac{d}{2m}s\Delta}. \quad (2)$$

Then according to Dounavis et al the following, known as the modified Lie product formula, is the result:

$$\lim_{m \to \infty} [P_m(s)]^m = e^{-d(\Lambda + s\Delta)}. \quad (3)$$

Equation (3) is one of a family of similar Lie product expressions whose advantage is to express, in the limit of small matrices, the exponential of the sum of two matrices as the "product" of the individual matrix exponentials. These expressions can be construed as a generalization of a well-known property of the scalar exponential to the matrix exponential. The particular form in equation (3) has the additional property that as m→∞

$$[P_m(s)]^m = e^{-d(\Lambda + s\Delta)} + O\left(\frac{1}{m^2}\right). \quad (4)$$

Figure 1:
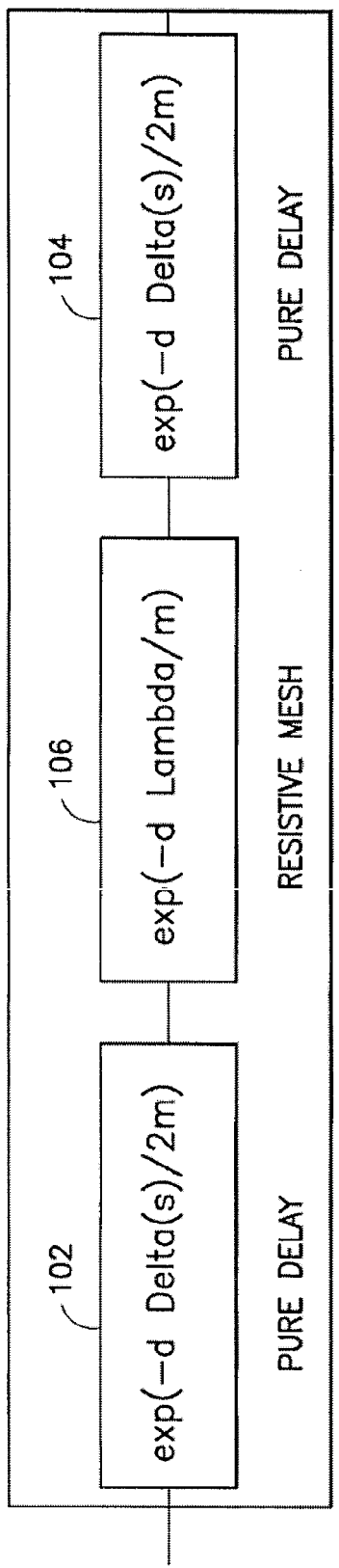
FIG. 1 is a schematic block diagram of the building blocks of the Lie decomposition of a multiconductor transmission line macromodel.

From a transmission line viewpoint, the transfer matrix $P_m(s)$ defined in equation (2) can be interpreted as the concatenation of three building blocks. Referring to FIG. 1, a first delay element 102 and a second delay element 104 are identical to an ideal multiconductor transmission line of length d/2 m and characteristic impedance matrix $Z_0=(LC^{-1})^{1/2}$. Its transfer matrix is $D_m(s)=e^{-s\Delta d/2}$. A resistive mesh 106 located between the two delay elements represents the pure losses (series and dielectric) in a section of the transmission line of length d/m. Its transfer matrix, $E_m=e^{-\Lambda d/m}$, contains only resistive terms and has no explicit dependence on the s parameter. Focusing on the frequency-independent, single transmission line case, D(s) can be implemented using an ideal delay element of total delay $$\tau_m = \frac{d}{2m}\sqrt{LC}$$

The implementation of the middle term representing losses may require a polynomial or rational approximation of the exponential matrix $E_m$. However in the case when the dielectric losses are negligible, G≈0, the result is shown schematically in FIG. 3 including driver 300, a source resistance Rs 50Ω 302, a transmission line 304 having a length of 5 cm, impedance $Z_0$=50Ω, delay τ=2 ns/cm, per-unit-length resistance R=1 Ω/cm, and per-unit-length conductance G=0 mho/cm, and a load resistance $R_1$=150Ω 306.

Assuming the following theorem: if G=0, then $$E_m = \begin{bmatrix} I_n + \frac{d}{m}R & 0 \\ 0 & I_n \end{bmatrix},$$

where $I_n$ is the identity matrix of order n.

The above equality is exact and has the important practical implication that the series losses of each cell can be implemented exactly by synthesizing a resistive network whose resistance matrix is $$\frac{d}{m}R.$$

In the single line case, this reduces to a single two-terminal resistor of resistance $$\frac{d}{m}R.$$

Figure 2:
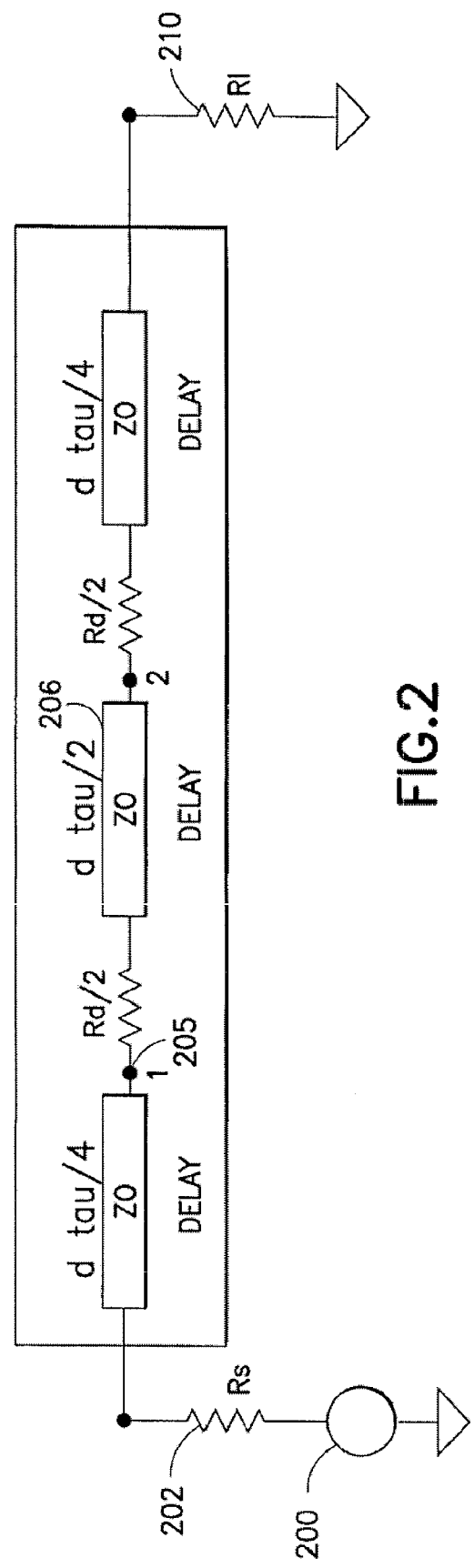
FIG. 2 is a schematic diagram of a Lie decomposition macromodel of order 2 for a frequency-independent single transmission line with the dielectric loss per unit length G=0.

Another advantage of this exact synthesis of the resistive losses is that it allows the study of the Lie decomposition error that is due solely to the segmentation of multiconductor transmission line into the cells shown in FIG. 1. FIG. 2 shows a Lie decomposition macromodel of order m=2 for a frequency-independent, single transmission line with G=0. The two delay elements of two successive cells have been combined in a single delay element, 206, of twice the cell delay. The remainder of the macromodel includes a source 200 and driver impedance $R_s$ 202 and a load resistance $R_1$ 210. Compared with known passive rational macromodeling, the major advantage of the Lie decomposition multiconductor transmission line modeling approach is its ability to efficiently handle long, low-loss lines while preserving the passivity of the macromodel.

Figure 3:
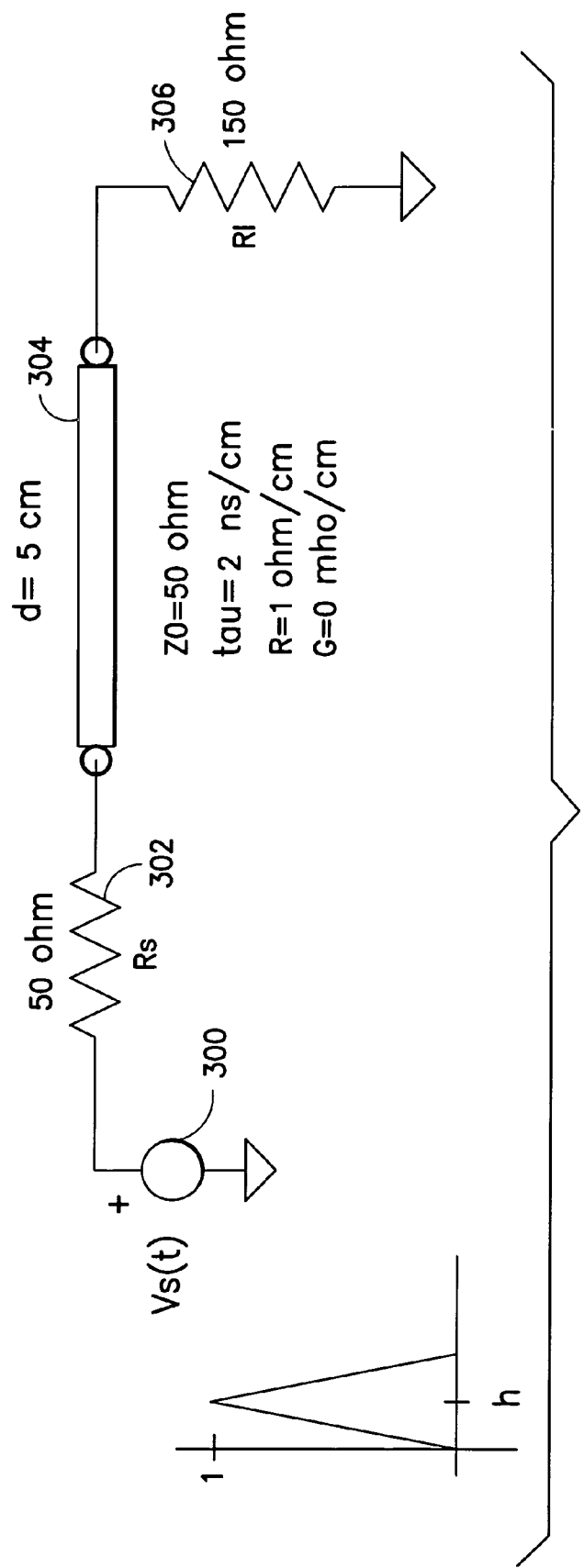
FIG. 3 is a schematic diagram of a single transmission line circuit with a driver and a load.
Figure 4:
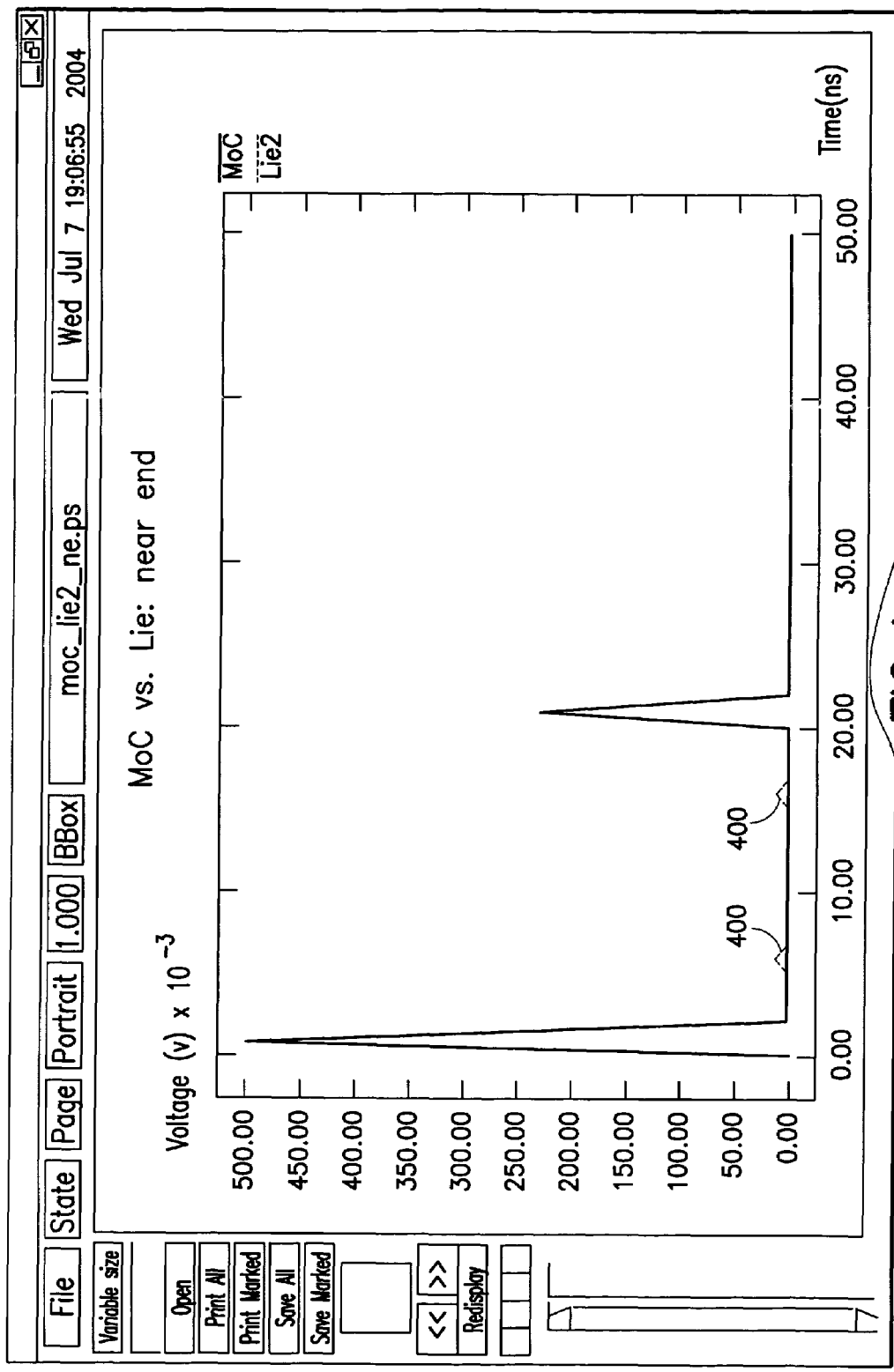
FIG. 4 is a graphical representation of the Method of Characteristics (MoC) and Lie waveforms at the near end of a transmission line.

In order to understand the impact of the approximation error due to the Lie decomposition, consider the single, frequency-independent transmission line of FIG. 3. The characteristic impedance of the line is $Z_0=50\Omega$, its per-unit-length delay is $\tau=2$ ns/cm, and its series per-unit-length resistance is $R=1$ $\Omega$/cm. The driver impedance is $R_s=50\Omega$. The load is a resistance $R_l=150\Omega$. The source generates an ideal triangular pulse signal of height 1.0 v and duration of 2 ns. The line is analyzed over a 50 ns time interval using two macromodeling algorithms. The first macromodeling algorithm is based on the Method of Characteristics (MoC) known to those skilled in the art and described, for example, in A. J. Gruodis et al entitled "Coupled lossy transmission line characterization and simulation" in IBM Journal of Research and Development, 25(1):25-41, January 1981; I. M. Elfadel et al entitled "A comparative study of two transient analysis algorithms for lossy transmission lines with frequency-dependent data" in IEEE Transactions on Advanced Packaging, 25(2):143-153, May 2002, and S. Grivet-Talocia et al entitled "Transient analysis of lossy transmission lines: An efficient approach based on the method of characteristics" in IEEE Transactions on Advanced Packaging, 27(1):45-56, February 2004. Each of these references is hereby incorporated herein by reference. The second macromodeling algorithm uses a Lie decomposition of order 2 (see FIG. 2). The results of the analysis is shown in FIG. 4 for the near end of the transmission line. The near-end MoC and Lie waveforms are identical for the main pulse centered at 1 ns and the reflected pulse centered at 21 ns. The latter pulse is due to the reflection at the unmatched load $R_l$. It has a delay of 20 ns after a round trip along the transmission line. The Lie waveform exhibits several spurious triangular pulses, the most prominent of which are centered at 6, 16, 26, and 36 ns, as shown in FIG. 4, 400.

Figure 5:
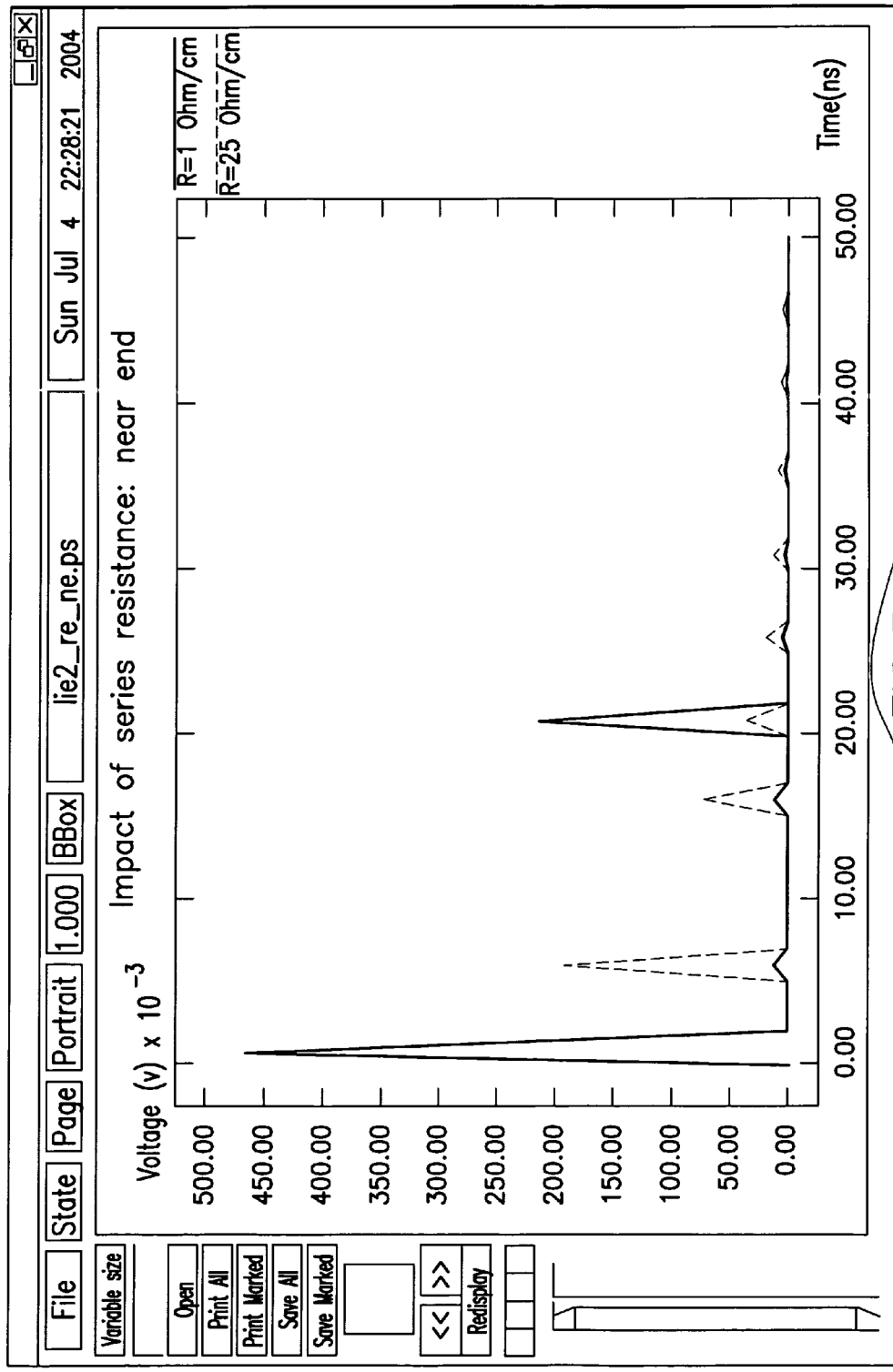
FIG. 5 is a graphical representation of the Method of Characteristics (MoC) and Lie waveforms at the near end of a transmission line as a function of series resistance.

FIG. 5 shows the impact of series resistance on the spurious pulse. An increase in the per-unit-length resistance from 1 $\Omega$/cm to 25 $\Omega$/cm results in a significant increase in the height of the spurious pulses. For instance, in the near-end, this increase is about 16× and 6× for the spurious pulses at 6 and 16 ns, respectively. An interesting observation is that the reflected pulse at 21 ns has decreased by about 6× to become lower than the spurious pulse. Any noise thresholding strategy designed to eliminate spurious pulses would also result in the elimination of waveform details that are due to the physics of the problem.

Figure 6:
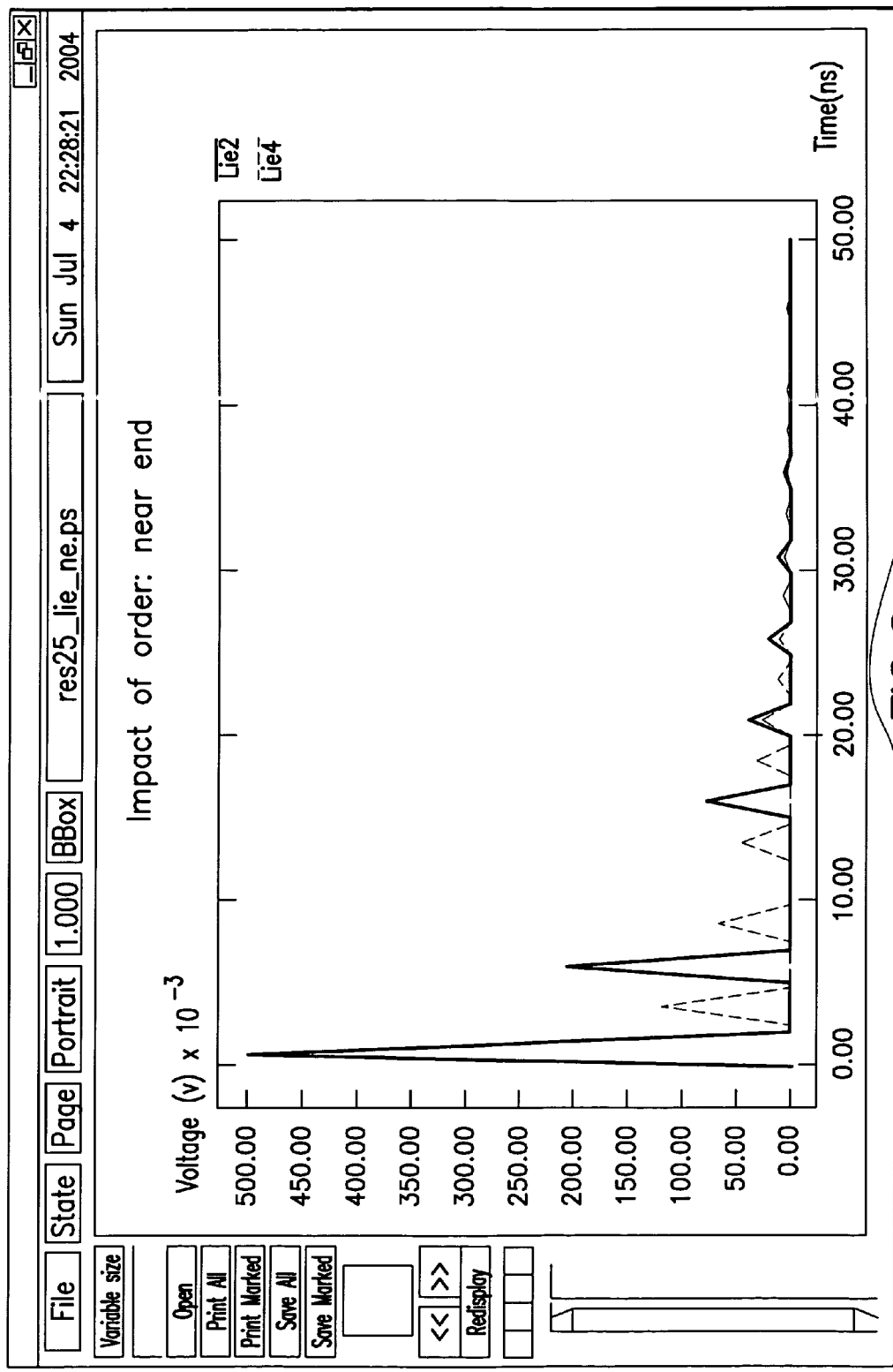
FIG. 6 is a graphical representation of the Method of Characteristics (MoC) and Lie waveforms at the near end of a transmission line as a function of the decomposition order.

The next set of simulation experiments considers the impact of the Lie decomposition order. This order is defined as the number m of blocks, see FIG. 1, into which the line is segmented. When the order is increased the number of spurious pulses increases but their height decreases. FIG. 6 shows a comparison between the cases when m=2 and m=4 (with R=25 $\Omega$/cm). In the near-end waveform, the number of spurious pulses between the incident pulse and the reflected pulse increases from 2 to 4, but the height of, for example, the first spurious pulse decreases by about 50%.

In order to explain the above observations, define for each cell of the Lie decomposition the following two quantities:

Reflection coefficient $$\rho = \frac{1}{1 + \frac{2mZ_0}{R_{tot}}},$$

Voltage drop ratio:

$$\delta = \frac{1}{1 + \frac{R_{tot}}{mZ_0}}, \tag{5}$$

where $R_{tot}$ is the total resistance of the transmission line Rd. The incident pulse on the transmission line is given by $V_i = \delta_s V_s$ with $$\delta_s = \frac{Z_0}{R_s + Z_0}$$

being the voltage drop ratio at the source. First, analyze the near-end waveform. The first spurious pulse at the near end is due to the impedance mismatch at node 1, FIG. 2, 205, between the characteristic impedance $Z_0$ of the first delay element and the load seen by the transmitted wave $V_i$. This load is given by $$\frac{R_{tot}}{m} + Z_0.$$

This first reflected pulse takes a time of $$\frac{d\tau}{2m}$$

to arrive at the near end with a height equal to $\rho V_i$. The forward-traveling pulse $V_i$ undergoes its first voltage drop along the resistor of the first cell and becomes height $\delta V_i$. It is then reflected in the second cell due to the impedance mismatch between its delay element and its resistor. The reflected pulse has height $\rho \delta V_i$ and undergoes a voltage drop due to the resistor on the return path thus making its height $\rho \delta^2 V_i$. This analysis shows that the number of spurious pulses at each end of the transmission line is equal to the number of impedance mismatches in the macromodel. With one mismatch in each cell, the number of spurious waveforms is m. Also, because of the voltage drop ratio in each cell, the height of the spurious peaks is a decreasing function of their arrival times. The height ratio between any two successive spurious pulses is given by $\delta^2$. Furthermore, because $\rho$ is an increasing function of the per-unit-length resistance, an increase in per-unit-length resistance results in an increase in the height of the spurious pulse. The far-end waveform can be analyzed in a similar manner.

Because $\delta<1$, the worst-case peak is given by the first reflected pulse, and so the worst-case relative error $e_r$ is given by the reflection coefficient in equation (5). For $e_r$ to be less than a given tolerance x, the following inequality must be satisfied $$e_r = \rho = \frac{1}{1 + \frac{2mZ_0}{R_{tot}}} < x \text{ or } m > \frac{1-x}{x} \frac{R_{tot}}{2Z_0} \tag{6}$$

The lower bound on m is a significant result of the present invention. As an example, let x=0.01 (1% error tolerance) and $Z_0$=50Ω, then inequality (6) becomes m>0.99 $R_{tot}$ where $R_{tot}$ is expressed in ohms. In other words, the transmission line should be segmented such that every segment has at most 1Ω of resistance for the Lie macromodel to guarantee a 1% error tolerance. This rule of thumb translates into at least 5 segments for the transmission line of FIG. 2.

When the dielectric loss G is nonzero, the resistive mesh is no longer a simple two-terminal resistor. However, a first order Padé approximation of the loss transfer matrix can be derived and synthesized into a resistive mesh. A lower bound similar to inequality (6) can also be derived for this case.

Figure 7:
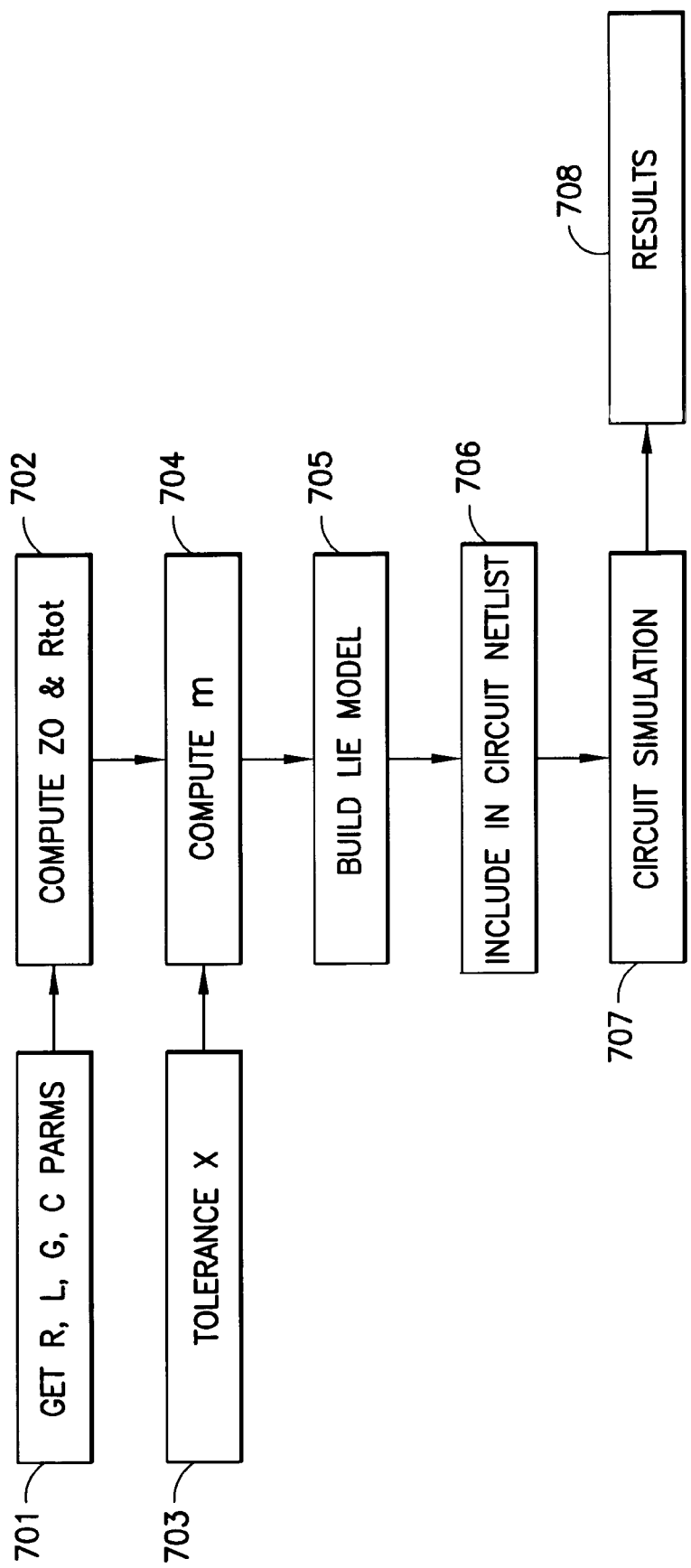
FIG. 7 is a flow chart of a method of performing circuit simulation of a transmission line in accordance with the teachings of the present invention.

FIG. 7 is a flow chart of the process for performing circuit simulation of a transmission line macromodel based on the Lie criteria. Initially, the per-unit-length resistance R, inductance L, conductance G, and capacitance C are obtained in step 701. Next, the values of $Z_0$ and $R_{tot}$ are computed in step 702. A predetermined engineering tolerance x for the time-domain error is provided in step 703. The tolerance value x is used with the previously computed values of $Z_0$ and $R_{tot}$ to compute the value m, the selected order or the number of segments into which the transmission line is divided, according to equation 6 in step 704. Using the computed value m, build a Lie macromodel of the transmission line containing m cells in step 705. A circuit netlist of the macromodel is included as is known in the art in step 706. Using the netlist, a circuit simulation of the transmission line is performed in step 707. The results in step 708 of the circuit simulation of the transmission line are the output of the process.

In summary, the results of Dounavis et al are combined with transmission line theory to derive a new time-domain error criterion for the Lie product macromodel. The derivation of this error criterion is based on a time-domain analysis of the error-generation mechanism, namely, the impedance mismatch between the characteristic impedance of the delay element and the impedance of the lumped circuit in each cell of the macromodel. This error criterion is then used to derive a lower bound on the number of cells needed in the macromodel so that their worst-case magnitude of the time-domain error is less than a given engineering tolerance.

While there has been described and illustrated a method for performing circuit simulation of a multiconductor transmission line based on a Lie decomposition macromodel combined with transmission line theory, it will be apparent to those skilled in the art that variations and modifications are possible without deviating form the broad scope and teachings of the present invention which shall be limited solely by the scope of the claims appended hereto.

What is claimed is:

1. A method of obtaining a macromodel of a transmission line based on Lie criteria, comprising the steps of:
   determining electrical parameters of a transmission line to be modeled;
   computing a characteristic impedance matrix of the transmission line;
   computing a total resistance of the transmission line;
   selecting a predetermined tolerance value for a time-domain error criterion for a macromodel of the transmission line; and
   computing, as a function of the total resistance and the predetermined tolerance value, a lower bound on a number of segments into which the transmission line is to be divided in a Lie product macromodel of the transmission line;
   where said computing the lower bound on the number of segments, m, solves the equation $$m > \frac{1-x}{x} \frac{R_{tot}}{2Z_0},$$

where x is the predetermined tolerance value, $R_{tot}$ is the total resistance of the transmission line and $Z_0$ is the characteristic impedance matrix of the transmission line.

2. A method of obtaining a macromodel of a transmission line based on Lie criteria as set forth in claim 1, further comprising the step of building a Lie product macromodel of the transmission line.

3. A method of obtaining a macromodel of a transmission line based on Lie criteria as set forth in claim 2, further comprising the steps of including a circuit netlist of the macromodel of the transmission line and performing a circuit simulation of the transmission line using the netlist.

4. A method of obtaining a macromodel of a transmission line based on Lie criteria as set forth in claim 1, wherein the electrical parameters comprise per-unit-length resistance parameter matrix, per-unit-length inductance parameter matrix, per-unit-length conductance parameter matrix, and per-unit-length capacitance parameter matrix of the transmission line.

5. A method of obtaining a macromodel of a transmission line based on Lie criteria as set forth in claim 1, wherein the characteristic impedance matrix of the transmission line is
   $(LC^{-1})^{1/2}$, where L is the per-unit-length inductance parameter matrix of the transmission line and C is the per-unit-length capacitance parameter matrix of the transmission line.

6. A method of determining a selected order in a passive transmission line macromodel based on Lie criteria, comprising the steps of:
   determining the total resistance $R_{tot}$ of the transmission line to be modeled;
   determining the characteristic impedance matrix $Z_0$ of the transmission line;
   selecting a predetermined tolerance value x for a time-domain error criterion for the Lie macromodel; and
   calculating a lower bound on a selected order m segments into which the macromodel models the transmission line by solving the equation $$m > \frac{1-x}{x} \frac{R_{tot}}{2Z_0}.$$

7. A method of claim 6, wherein the characteristic impedance matrix of the transmission line is
   $(LC^{-1})^{1/2}$, where L is the per-unit-length inductance parameter matrix of the transmission line and C is the per-unit-length capacitance parameter matrix of the transmission line.

* * * * *